United States Patent [19]

Cho

[11] Patent Number: 5,536,667
[45] Date of Patent: Jul. 16, 1996

[54] METHOD FOR FORMING A GATE ELECTRODE IN A SEMICONDUCTOR DEVICE

[75] Inventor: Byung J. Cho, Kyungki-Do, Rep. of Korea

[73] Assignee: Hyundai Electronics Industries Co., Ltd., Kyunghi-Do, Rep. of Korea

[21] Appl. No.: 440,971

[22] Filed: May 15, 1995

[30] Foreign Application Priority Data

May 25, 1994 [KR] Rep. of Korea ................. 94-11334

[51] Int. Cl.⁶ ................................. H01L 21/8247
[52] U.S. Cl. ........................... 437/43; 437/193
[58] Field of Search .................. 437/43, 193, 199

[56] References Cited

U.S. PATENT DOCUMENTS

| | | |
|---|---|---|
| 4,334,292 | 6/1982 | Kotecha . |
| 4,442,449 | 4/1984 | Lehrer et al. . |
| 5,110,753 | 5/1992 | Gill et al. ................. 437/52 |
| 5,336,903 | 8/1994 | Ozturk et al. ............. 257/19 |
| 5,422,289 | 6/1995 | Pierce ...................... 437/32 |

FOREIGN PATENT DOCUMENTS

| | | | |
|---|---|---|---|
| 0511628A | 11/1992 | European Pat. Off. | ......... 437/43 |
| 3205830A | 9/1991 | Japan | ............. 437/193 |

*Primary Examiner*—George Fourson
*Assistant Examiner*—Richard A. Booth
*Attorney, Agent, or Firm*—Fish & Richardson

[57] ABSTRACT

A method for forming a gate electrode in a semiconductor device is disclosed. An injection of the holes which moved from the control gate to a dielectric layer is suppressed since the control gate electrode is formed with a double layer structure composed of polysilicon-germanium and polysilicon. Accordingly, the data retention time is increased by increasing the energy barrier for a hole.

2 Claims, 3 Drawing Sheets

METHOD FOR FORMING A GATE ELECTRODE IN A SEMICONDUCTOR DEVICE

FIELD OF THE INVENTION

This invention relates to a method for forming a gate electrode in a semiconductor device, and more particularly to a method for forming a control gate electrode having a double layer structure formed of polysilicon-germanium and polysilicon to erect an energy barrier for a hole and to increase data retention time.

BACKGROUND

Generally, data retention time, indicating the duration of time that stored data is preserved in a floating gate is one of the most important factor in a flash EEPROM device. Loss of data stored in the floating gate occurs when the data is read at which time a positive bias is applied to the control gate; that is, such loss of stored data occurs by an injection of the holes which are moved from the control gate to a dielectric layer and by a leakage of a current which flowed to a tunnel oxide.

What is more, a high capacitance coupling ratio is needed between a control gate and a floating gate of a flash EEPROM device. Therefore, in the flash EEPROM fabrication process, an interpoly dielectric layer having a three layer structure formed of a bottom oxide layer, a nitride layer and a top oxide layer (hereinafter, referred to as "ONO") is necessary instead of an oxide layer. However, since the nitride layer has a small band gap, the data retention time is reduced by an injection of the holes moved from the control gate if the top oxide layer is thin. Moreover, since the oxide layer does not grow more than 10 Å on the nitride layer by the thermal oxidation, the Chemical Vapor Deposition-(CVD) method is needed to form the top oxide layer. However, it is difficult to apply this method in the flash EEPROM fabrication process and a thick dielectric layer reduces the capacitance coupling ratio, therefore reducing the performance of the device.

SUMMARY OF THE INVENTION

Therefore, an object of the present invention is to provide a method for forming a control gate electrode so as to increase the energy barrier for a hole and increase a data retention time.

Another object of the present invention is to provide a method for forming a control gate electrode having a double layer structure composed of polysilicon-germanium and polysilicon.

A method for forming a gate electrode in a semiconductor device, comprising the steps of: forming a tunnel oxide layer on a silicon substrate; depositing a first polysilicon layer on said tunnel oxide layer and doping an impurity ion in said polysilicon to form a floating gate; sequentially forming a bottom oxide layer, a nitride layer and a top oxide layer on said floating gate to form an interpoly dielectric layer; depositing a polysilicon-germanium layer having a large energy barrier for a hole and a second conductor on said interpoly dielectric layer to form a first portion of the control gate depositing a second polysilicon layer on said first portion of the control gate and doping an impurity ion in said second polysilicon layer to form a second portion of the control gate; and sequentially patterning said second and first portions of the control gate, said interpoly dielectric layer, said floating gate and said tunnel oxide layer using lithography and dry etching method.

BRIEF DESCRIPTION OF THE INVENTION

For a fuller understanding of the nature and the objective of the invention, reference should be made to the following detailed description in conjunction with the accompanying drawings in which:

FIG. 1 to FIG. 7 are cross sectional views of a method for forming a gate electrode in a semiconductor device according to the present invention.

DETAILED DESCRIPTION OF TEE INVENTION

FIG. 1 to FIG. 7 are cross sectional views of a method for forming a gate electrode in a semiconductor device according to the present invention.

Figure 1:
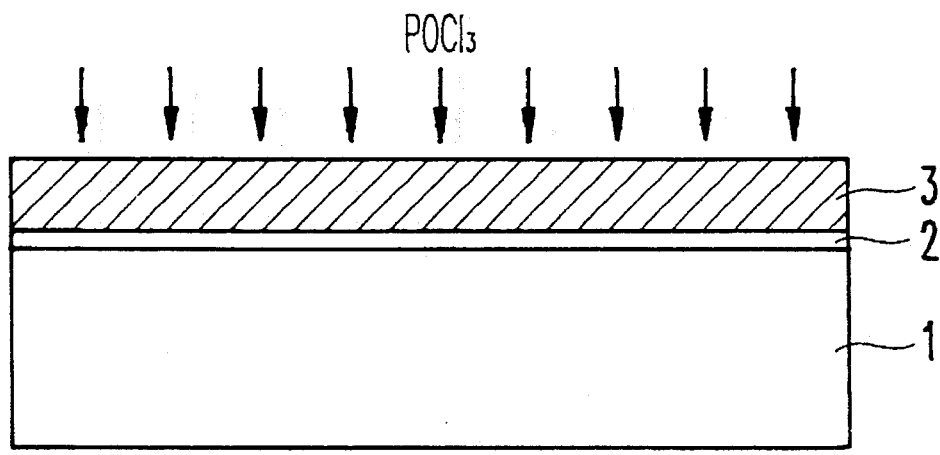

Referring to FIG. 1 a tunnel oxide layer 2 is formed on a silicon substrate 1. A first polysilicon layer is deposited on the tunnel oxide layer 2 to a thickness of about 1000 to 2000 Å, which is then doped with impurity ion such as a $POCl_3$, thereby forming a floating gate 3.

Figure 2:
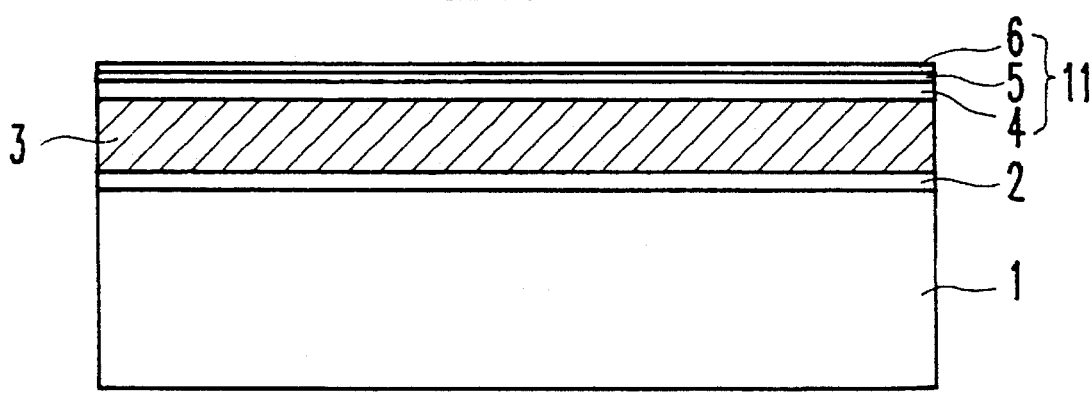

Referring to FIG. 2 a bottom oxide layer 4 is formed on the floating gate 3. A nitride layer 5 is deposited on the bottom oxide layer 4 by means of a chemical vapor deposition method and a thin top oxide layer 6 of about 8 to 15 Å in thickness is formed by means of thermal oxidation of the surface of the nitride layer 5. An interpoly dielectric layer 11 comprised of the bottom oxide layer 4, the nitride layer 5 and the top oxide layer 6. That is, has an ONO structure.

Figure 3:
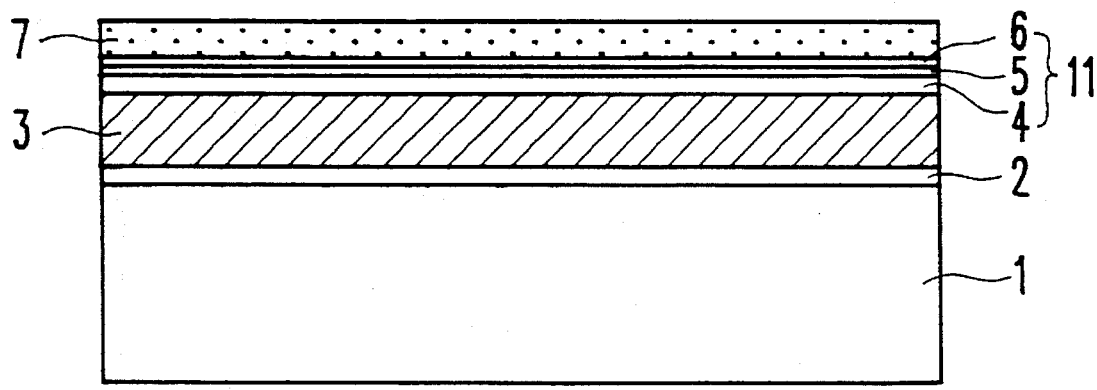

Referring to FIG. 3 a polysilicon-germanium layer having a large energy barrier for a hole is deposited on the interpoly dielectric layer 11 to a thickness of about 200 to 1000 Å, thereby forming a first portion 7 of the control gate 7. The first conductor is polysilicon-germanium. The polysilicon-germanium is deposited by means of a chemical vapor deposition method using $SiH_4$ gas and $GeH_4$ gas at a temperature of 600 to 650 degrees celsius and 50 to 300 mTorr pressure; at such time, the atomic percent of the germanium(Ge) is 20 to 50.

Figure 4:
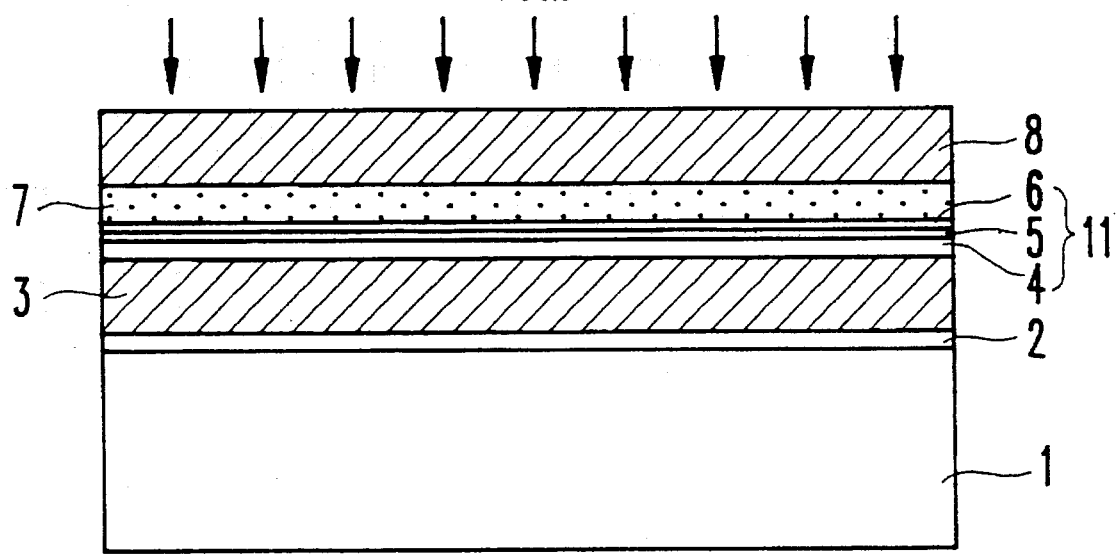

Referring to FIG. 4 a polysilicon layer is deposited on the first portion 7, thereby forming a second portion 8 of the control gate. The polysilicon layer and is then doped with an impurity ion such as a $POCl_3$ after the deposition.

Figure 5:
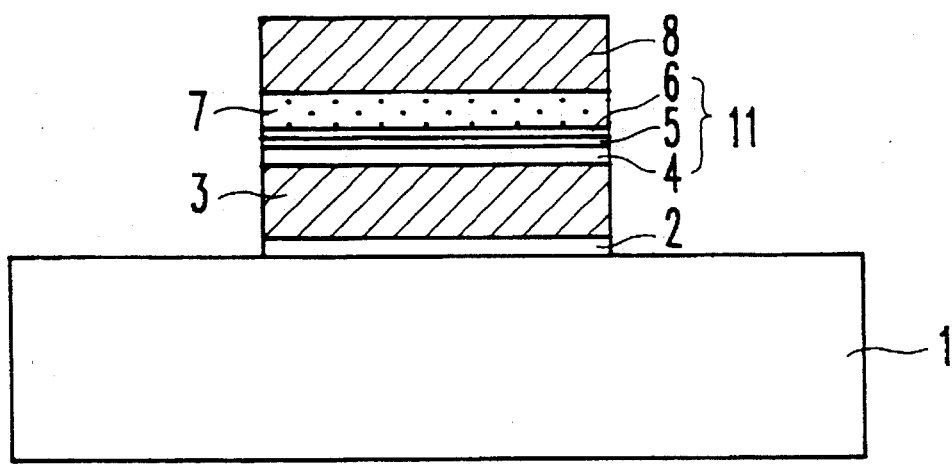

Referring to FIG. 5 the second and the first portions 8 and 7, respectively, the interpoly dielectric layer 11, the floating gate 3 and the tunnel oxide layer 2 are patterned sequentially by a lithography etching process. The etching process used is the dry etch method.

Figure 6:
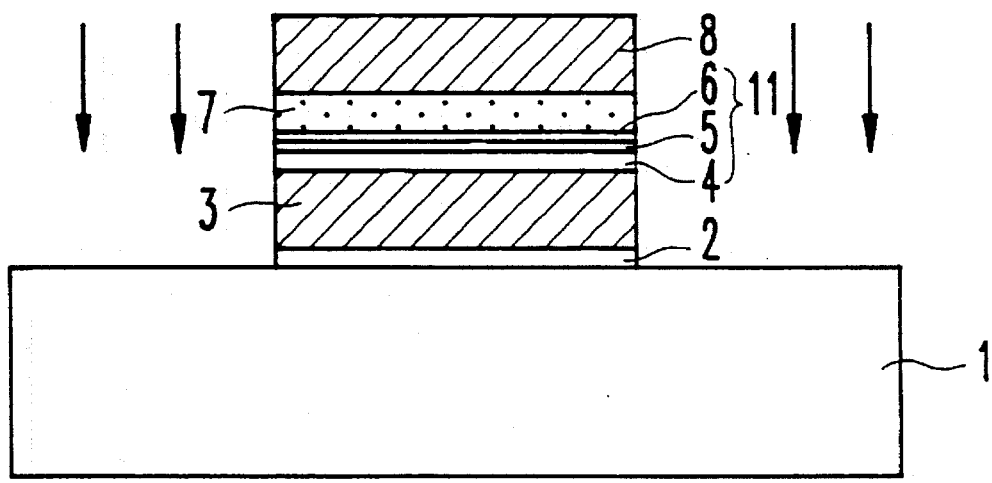
Figure 7:
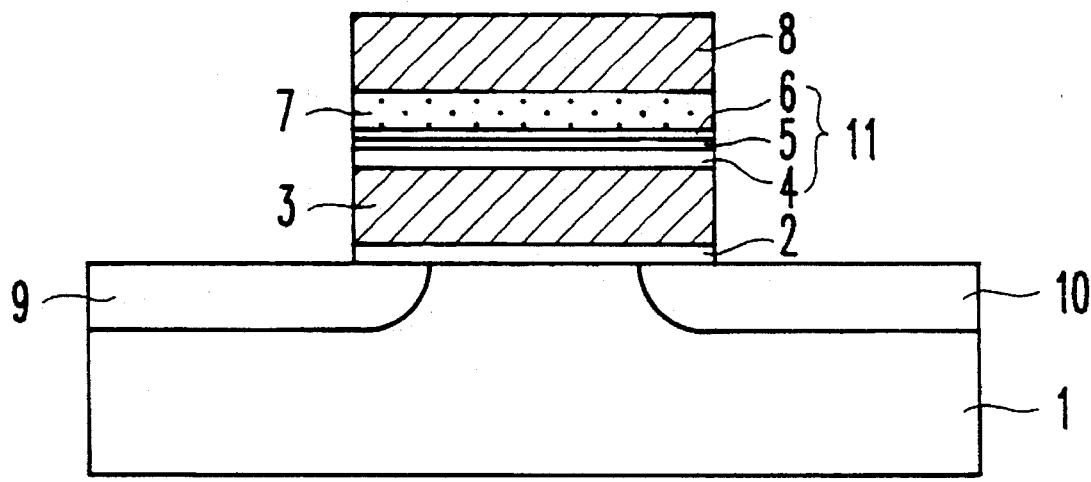

Referring to FIG. 6 an impurity ion such as a arsenic($A_s$) is implanted on the exposed silicon substrate 1, and referring to FIG. 7, a source region and a drain region 9 and 10 are formed by implantation of impurity ions, thereby forming a flash EEPROM cell.

The band width of the polysilicon-germanium is narrower than that of silicon. In the band structure of the polysilicon-germanium, an energy level of conduction band is nearly same as that of silicon but an energy level of valance band is higher than that of silicon. Therefore, if the portion of the control gate electrode in contact with a dielectric layer is formed with polysilicon-germanium, the barrier for an electron is not changed significantly but the barrier for a hole rises. Therefore an injection of the holes which move from the control gate is suppressed without increasing the thickness of the top oxide layer.

As described the above, according to the present invention, a control gate electrode having a double layer structure made of polysilicon-germanium and polysilicon, whereby an energy barrier for holes which moves from the control gate to the dielectric layer is raised and data retention time is increased. As a result, the memory device's reliability is enhanced. Additionally, an injection of the holes which move from the control gate is suppressed without increasing the thickness of the top oxide layer, thereby increasing the capacitance coupling ratio and the upper layer of the control gate is formed with polysilicon, whereby a connection process is applicable to a former process.

Although this invention has been described in its preferred form with a certain degree of particularity, those skilled in the art can readily appreciate that the present disclosure of the preferred form has been made only by way of example and that numerous changes in the details of the construction, combination and arrangement of parts may be resorted to without departing from the spirit and scope of the invention.

What is claimed is:

1. A method for forming a gate electrode in a semiconductor device, comprising the steps of:

forming a tunnel oxide layer on a silicon substrate;

depositing a first polysilicon layer on said tunnel oxide layer and doping an impurity ion in said polysilicon to form a floating gate;

sequentially forming a bottom oxide layer, a nitride layer and a top oxide layer on said floating gate to form an interpoly dielectric layer;

depositing a polysilicon-germanium layer having a larger energy barrier than polysilicon for a hole on said interpoly dielectric layer to form a first portion of a control gate;

depositing a second polysilicon layer on said first portion of the control gate and doping an impurity ion in said second polysilicon layer to form a second portion of the control gate; and sequentially patterning said first and second portions of the control gate, said interpoly dielectric layer, said floating gate and said tunnel oxide layer using a photolithography and dry etching process.

2. A method according to claim 1, wherein said polysilicon-germanium layer is deposited with a thickness of 200 to 1000 angstroms.

* * * * *